(12) United States Patent
Oohira

(10) Patent No.: US 7,911,554 B2
(45) Date of Patent: Mar. 22, 2011

(54) LIQUID CRYSTAL DISPLAY MODULE

(75) Inventor: Eiji Oohira, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 102 days.

(21) Appl. No.: 12/055,392

(22) Filed: Mar. 26, 2008

(65) Prior Publication Data

US 2008/0239192 A1     Oct. 2, 2008

(30) Foreign Application Priority Data

Mar. 28, 2007   (JP) ................................. 2007-083271

(51) Int. Cl.
*G02F 1/1333* (2006.01)
(52) U.S. Cl. .............................. 349/58; 349/65; 349/150
(58) Field of Classification Search .......................... None
See application file for complete search history.

(56) References Cited

U.S. PATENT DOCUMENTS

| 7,113,236 B2 * | 9/2006 | Du ................................. 349/58 |
| 2005/0018102 A1 * | 1/2005 | Hirano ............................ 349/58 |
| 2005/0088830 A1 * | 4/2005 | Yumoto et al. ................ 361/749 |
| 2005/0183884 A1 * | 8/2005 | Su ................................. 174/257 |

FOREIGN PATENT DOCUMENTS

JP     7-270814     10/1995

* cited by examiner

*Primary Examiner* — Richard H Kim
(74) *Attorney, Agent, or Firm* — Antonelli, Terry, Stout & Kraus, LLP.

(57) ABSTRACT

A liquid crystal display module includes a liquid crystal display panel, a backlight and a frame-shaped mold frame capable of mounting the liquid crystal display panel thereon and housing the backlight. On a flexible printed circuit board which has one end thereof connected to the liquid crystal display panel, a light source is mounted in a state that the light source faces a light incident surface of a light guide plate in an opposed manner. A plurality of electronic components are mounted in the vicinity of the light source. A housing portion for housing the plurality of electronic components is formed in the mold frame. The plurality of electronic components is mounted in a state that terminals of the electronic components are arranged in the direction perpendicular to the light incident surface of the light guide plate.

7 Claims, 6 Drawing Sheets

LIQUID CRYSTAL DISPLAY MODULE

CROSS-REFERENCE TO RELATED APPLICATION

The present application claims priority from Japanese application JP2007-264503 filed on Oct. 10, 2007, the content of which is hereby incorporated by reference into this application

BACKGROUND OF THE INVENTION

1. Field of the Invention

The present invention relates to a liquid crystal display module mounting a backlight thereon, and more particularly to a technique which is preferably applicable to a small-sized liquid crystal display module used for a mobile phone or the like.

2. Description of the Related Art

FIG. 10 shows the cross-sectional constitution of an essential part of a conventional liquid crystal display module.

In the conventional liquid crystal display module, a liquid crystal display panel is configured by sandwiching a liquid crystal layer not shown in the drawing between a TFT substrate 11 and a color filter substrate 12 (hereinafter referred to as a CF substrate 12). The TFT substrate 11 is larger than the CF substrate 12 in size. In a region of the TFT substrate 11 which does not overlap with the CF substrate 12, a driver chip 13 which controls driving of the liquid crystal display panel is arranged. An upper polarizer 14 is arranged on the CF substrate 12, and a lower polarizer 21 is also arranged on a lower side of the TFT substrate 11. Further, a backlight is arranged below the liquid crystal display panel thus constituting the liquid crystal display module.

The backlight is constituted of light sources 18 such as LEDs, for example, arranged on a flexible printed circuit board 15 (hereinafter referred to as an FPC 15), and a light guide plate 17 which leads light radiated from the light sources 18 to the whole liquid crystal display panel. An optical sheet 22 is arranged between the light guide plate 17 and the liquid crystal display panel. The optical sheet is formed of, for example, an upper diffusion sheet, an upper prism sheet, a lower prism sheet, a lower diffusion sheet and the like. A reflection sheet 23 is arranged below the light guide plate 17 and plays a role of directing light led to a lower side of the light guide plate 17 toward a liquid crystal display panel side. To satisfy a demand for the reduction of thickness of the liquid crystal display device, the light guide plate 17 is configured to have a small thickness except for a light incident surface which faces the light sources 18. The reason the light incident surface has a large thickness is that, a size of the LED currently preferably used as the light source 18 is larger than a thickness of the light guide plate, and a size of the light incident surface of the light guide plate 17 is increased to conform to the size of the LED. In FIG. 10, numeral 16 indicates a mold frame. The liquid crystal display module is configured by arranging the liquid crystal display panel on an upper side of the frame-shaped mold frame 16 and by arranging the backlight on a lower side of the mold frame 16.

On the FPC 15, in addition to the light sources 18, electronic components (longitudinally-arranged electronic components 19, laterally-arranged electronic components 101, 102) such as capacitors and resistors are mounted. These electronic components (19, 101, 102) are housed in the inside of a recessed housing portion 32 formed in the mold frame 16.

Patent document 1 (JP-A-7-270814) discloses such constitution for housing the electronic components mounted on the FPC 15 in the mold frame 16.

SUMMARY OF THE INVENTION

Recently, a demand for narrowing a picture frame size of a liquid crystal display device is remarkably increased along with a demand for the reduction of thickness of the liquid crystal display device. When the liquid crystal display device has the constitution shown in FIG. 10, for decreasing a projecting amount (L2 in FIG. 10) of an FPC 15 from a liquid crystal display panel, it is necessary to decrease a length (L3 in FIG. 6) of a housing portion 32 for housing the electronic components (19, 101, 102) mounted on the FPC 15.

It is an object of the present invention to provide a liquid crystal display device having a narrow picture frame size.

To achieve the above-mentioned object, in the present invention, as a countermeasure for decreasing the length L3 of the housing portion 32 which becomes a key for realizing the liquid crystal display device having the narrow picture frame size, inventors of the present invention have focused on the directions of electronic components (19, 101, 102) mounted on the FPC 15.

FIG. 11 is a top plan view showing a state that a plurality of electronic components (19, 101, 102) and light sources 18 are mounted on the FPC 15. Here, a cross-sectional view taken along an extending line of a line A-A' in FIG. 11 corresponds to FIG. 10. As shown in FIG. 11, conventionally, the plurality of electronic components (19, 101, 102) is housed in the housing portion 32 of the mold frame 16.

FIG. 12A and FIG. 12B are views showing the relationship among soldering pads 120, a longitudinally-arranged electronic component 19, and external terminals 191 of the electronic component 19 which are mounted on the FPC 15.

When the electronic component 19 mounted on the FPC 15 is an electronic component having two terminals as shown in FIG. 12, the electronic component 19 is mounted on the FPC 15 by reflow soldering. Here, the inventors of the present invention have found out and have focused on a phenomenon that although the electronic component 19 is easily displaced in the lateral direction (lateral direction in FIG. 12A) as shown in FIG. 12A, the electronic component 19 is hardly displaced in the longitudinal direction (vertical direction in FIG. 12B) as showing in FIG. 12B.

In the conventional constitution, as shown in FIG. 11, in the electronic components 19 mounted on the FPC 15 and housed in the inside of the housing portion 32 of the mold frame 16, the laterally-arranged electronic components 101, 102 and the longitudinally-arranged electronic component 19 are present in mixture. Accordingly, with respect to the laterally-arranged electronic components 101, 102, there exists the possibility that these components are displaced in the longitudinal direction and hence, it is necessary to ensure large clearances (L4, L5 in FIG. 10) between the electronic components 101, 102 and the housing portion 32 of the mold frame 16.

The present invention realizes the narrowing of a picture frame size of a liquid crystal display device by aligning the directions of the electronic components mounted on the FPC 15 and housed in the housing portion 32 of the mold frame 16.

According to one aspect of the present invention, for example, a liquid crystal display module includes a liquid crystal display panel constituted by overlapping a TFT substrate and a CF substrate, a backlight including a light guide plate arranged at a position where the light guide plate faces a display region of the liquid crystal display panel, a light source constituted of an LED or the like arranged on one side surface (light incident surface) of the light guide plate, and a frame-shaped mold frame for housing the backlight and mounting the liquid crystal display panel thereon. The liquid crystal display module includes a flexible printed circuit board which has one end thereof connected to a TFT substrate of the liquid crystal display panel and another end thereof configured to mount the above-mentioned light source thereon, and is arranged to surround a frame body constituting the mold frame. On a side of the flexible printed circuit board on which the light source is mounted, a plurality of electronic components such as capacitors, resistors or diodes, for example, are mounted. A housing portion formed in a recessed shape for housing the plurality of electronic components is formed in the mold frame. The plurality of electronic components is mounted in a state that the terminals of each electronic component are arranged in the direction perpendicular to a light incident surface of the light guide plate.

According to the present invention, by aligning the arrangement direction of the electronic components in this manner, it is possible to minimize the possibility of arrangement displacement of the electronic components and hence, a length of the housing portion of the mold frame can be shortened thus providing a liquid crystal display device having a narrow picture frame size.

The present invention is considered to acquire the most advantageous effects when the plurality of electronic components is respectively constituted of an electronic component having two terminals.

Further, even when the plurality of electronic components are constituted by mixing the electronic components each having two terminals, the electronic components each having three terminals, and the electronic components each having four terminals, by setting the number of two-terminal electronic components larger than the total number which is an addition of the number of three-terminal electronic components and the number of four-terminal electronic components, the present invention is considered to acquire the advantageous effects of the present invention. That is, when the liquid crystal display panel is configured such that only the electronic components each having two terminals are housed in the housing portion of the mold frame, the present invention is considered to acquire the most advantageous effects. However, even when the electronic components each having three terminals and the electronic components each having four terminals are mixed in the electronic components each having two terminals, provided that the number of two-terminal electronic components is larger than the total number which is an addition of the number of three-terminal electronic components and the number of four-terminal electronic components, it is possible to acquire the advantageous effects of the present invention.

According to another aspect of the present invention, a liquid crystal display module includes a liquid crystal display panel, a backlight, and a frame-shaped mold frame capable of mounting the liquid crystal display panel thereon and capable of housing the backlight therein. The liquid crystal display module has the backlight which includes a light guide plate arranged at a position where the light guide plate faces the liquid crystal display panel in an opposed manner and a light source arranged to face a light incident surface formed on one side surface of the light guide plate in an opposed manner. The liquid crystal display module further includes a flexible printed circuit board which has one end thereof connected to the liquid crystal display panel and another end thereof configured to mount the light source thereon, and is arranged to surround a frame body constituting the mold frame. Further, in such a liquid crystal display module, a plurality of electronic components is mounted on a side of the flexible printed circuit board on which the light source is mounted. A housing portion for housing the plurality of electronic components is formed in the mold frame. Pads which correspond to one electronic component out of the plurality of electronic components is arranged on the flexible printed circuit board parallel to each other in the direction perpendicular to the light incident surface of the light guide plate.

Also according to the present invention, by aligning the direction of the pads with respect to the electronic components, it is possible to minimize the possibility of arrangement displacement of the electronic components and hence, a length of the housing portion of the mold frame can be shortened thus providing a liquid crystal display device having a narrow picture frame size.

According to the present invention, it is possible to provide a liquid crystal display device having a narrow picture frame size.

BRIEF DESCRIPTION OF THE DRAWINGS

FIG. 3A and FIG. 3B are views showing a shape of a mold frame, wherein FIG. 3A is a plan view showing the shape of the mold frame on a side on which the liquid crystal display module is mounted, and FIG. 3B is a back view showing the shape of the mold frame on a side on which a backlight is arranged;

DESCRIPTION OF THE PREFERRED EMBODIMENTS

The present invention is explained in detail hereinafter in conjunction with drawings.

Embodiment 1

Figure 1:
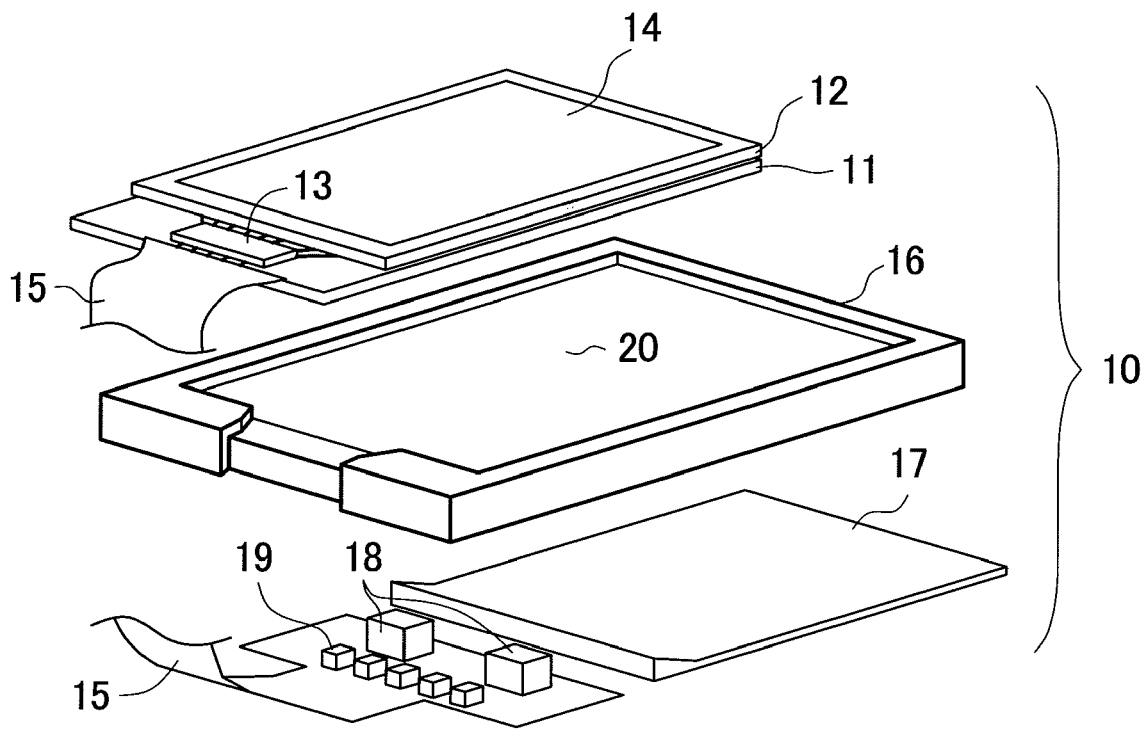
FIG. 1 is an exploded perspective view showing the constitution of a liquid crystal display module according to the present invention.

FIG. 1 shows the constitution of a liquid crystal display module 10 according to the present invention.

A liquid crystal display panel is configured by overlapping a TFT substrate 11 which is constituted of an insulating transparent substrate such as a glass substrate or a plastic substrate, for example, and a color filter substrate 12 (hereinafter, referred to as a CF substrate 12) with a liquid crystal layer sandwiched therebetween. Further, a driver chip 13 for controlling driving of the liquid crystal display panel is mounted on a portion of the TFT substrate 11 where the TFT substrate 11 and the CF substrate 12 do not overlap with each other. Further, one end of a flexible printed circuit board 15 (hereinafter, referred to as an FPC 15) is arranged on the TFT substrate 11 for supplying a signal to the driver chip 13. Further, an upper polarizer 14 is arranged on the CF substrate 12, and a lower polarizer is also arranged on the TFT substrate 11. Here, for arranging the driver chip 13 on the TFT substrate 11, the CF substrate is smaller than the TFT substrate in size. As a matter of course, when the driver chip is arranged on the CF substrate in a state that the CF substrate is arranged on a lower side of the TFT substrate different from the constitution shown in FIG. 1, the CF substrate is larger than the TFT substrate in size.

The liquid crystal display panel is arranged on an upper side of a frame-shaped mold frame 16 having a hole 20 formed in a center portion thereof. Further, on a lower side of the mold frame 16, an optical sheet consisting of an upper diffusion sheet, an upper prism sheet, a lower prism sheet, a lower diffusion sheet and the like not shown in the drawing, a light guide plate 17 and a reflection sheet 23 are arranged in a state that these parts are sandwiched between the lower side of the mold frame 16 and a portion of another end of the above-mentioned FPC 15. Here, light sources 18 formed of LEDs or the like are arranged on another end of the FPC 15 in a state that the light sources 18 face a side surface of the light guide plate 17 in an opposed manner.

One-side surface (incident surface) of the light guide plate 17 is arranged to face the light source 18 in an opposed manner, and the light guide plate 17 is housed in the mold frame 16 on a side opposite to a side in which the liquid crystal display panel is housed. Further, a reflection sheet 23 arranged below the light guide plate 17 is adhered to the mold frame 16 using an adhesive agent formed on a periphery of the reflection sheet 23 with a positional relationship shown in FIG. 2. In general, a backlight which arranges a light source on the side surface of a light guide plate in such a manner is referred to as a side backlight.

Figure 2:
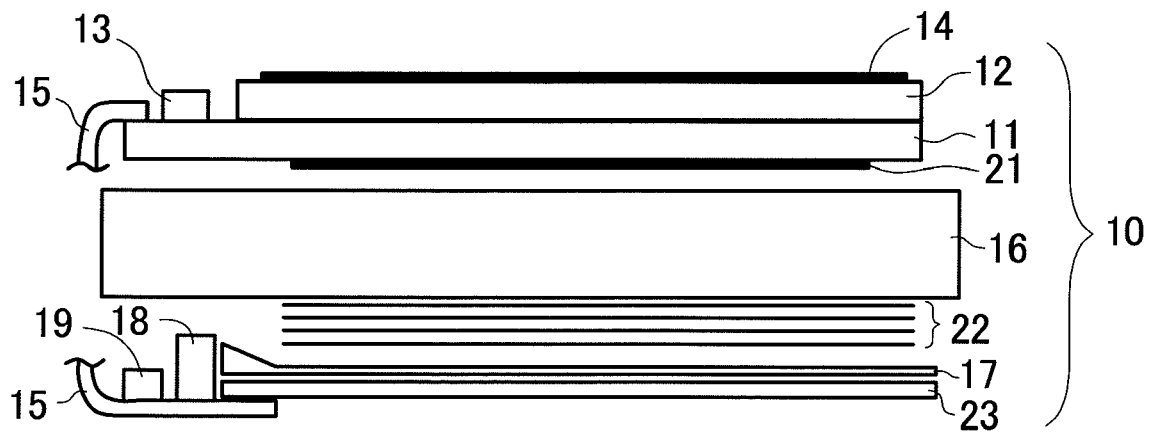
FIG. 2 is a side view showing the cross-sectional (side) constitution of the liquid crystal display module according to the present invention shown in FIG. 1.

FIG. 2 shows the cross-sectional (side) constitution of the liquid crystal display module according to the present invention shown in FIG. 1.

As shown in FIG. 2, a lower polarizer 21 is also arranged on the TFT substrate 11, and an optical sheet 22 is arranged between the light guide plate 17 and the liquid crystal display panel. Here, the reflection sheet 23 is arranged on a lower side of the light guide plate 17.

Figure 3A:
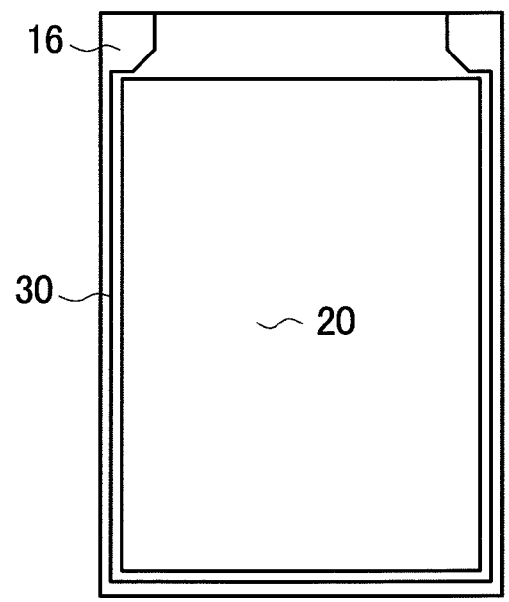
Figure 3B:
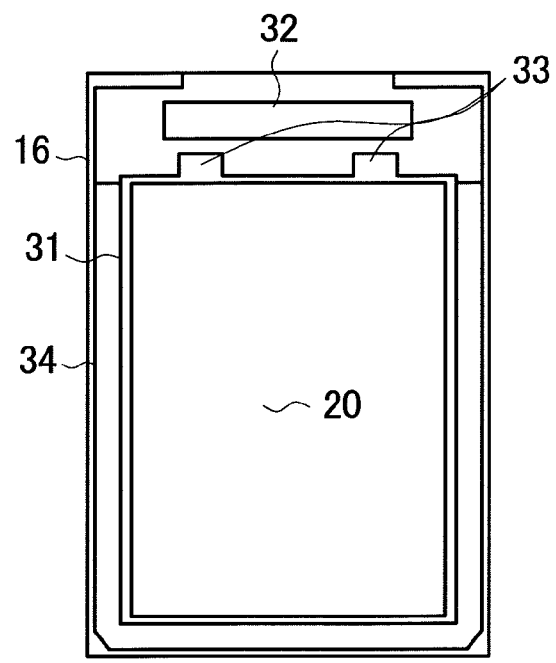

FIG. 3A and FIG. 3B are views for explaining a shape of the mold frame 16, wherein FIG. 3A is a plan view showing a shape of the mold frame 16 on a side on which the liquid crystal display module is mounted, and FIG. 3B is a back view showing the shape of the mold frame 16 on a side on which the backlight is arranged.

As shown in FIG. 3A, the liquid crystal display panel is arranged along a side wall 30 formed on the mold frame 16. Further, as shown in FIG. 3B, the light guide plate 17 is arranged along a side wall 31 formed on the mold frame 16, and the reflection sheet 23 is arranged along a side wall 34 formed on the mold frame 16. An adhesive material is formed on a peripheral side of the reflection sheet 23. By adhering the reflection sheet 23 to the mold frame 16 using the adhesive material, the backlight consisting of the light guide plate 17 and the like is housed in the inside of the mold frame 16.

In FIG. 3B, numeral 32 indicates a recessed housing portion formed in the mold frame 16. The housing portions 32 are formed to prevent the electronic components 19 such as capacitors and resistors mounted on the FPC 15 in a state shown in FIG. 4 from being in contact with the mold frame 16.

Further, numeral 33 in FIG. 3B indicates housing portions formed in the mold frame 16 for housing the light sources. The housing portions 33 are formed to prevent the light sources 18 such as LEDs mounted on the FPC 15 in a state shown in FIG. 1 from being in contact with the mold frame 16.

Figure 4:
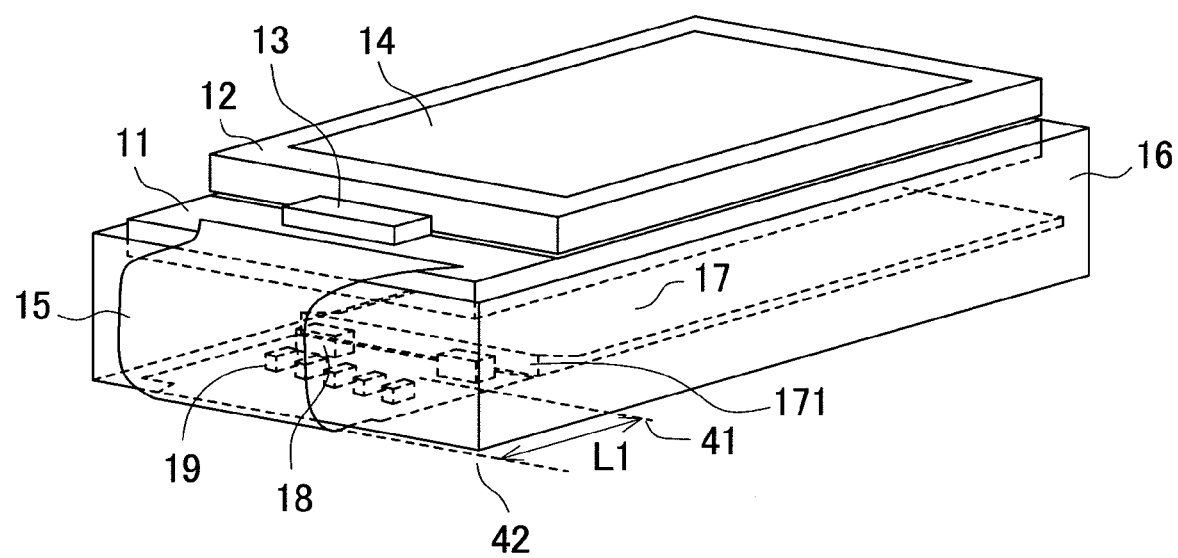
FIG. 4 is a perspective view showing the liquid crystal display module which is constituted by arranging a liquid crystal display panel on an upper side of the mold frame and the backlight on a lower side of the mold frame.

FIG. 4 shows the actually-formed liquid crystal display module which is configured by arranging the liquid crystal display panel on an upper side of the mold frame 16 and the backlight on a lower side of the mold frame 16. As shown in FIG. 4, although the electronic components 19 are mounted on the FPC 15, the electronic components 19 are prevented from being in contact with the mold frame 16 due to the housing portions 32 formed in the mold frame 16. Numeral 171 indicates a light incident surface of the light guide plate 17 which faces the light source 18 in an opposed manner. In the present invention, by shortening a distance L1 of the FPC 15 from end sides 41 of the housing portions 33 in which light sources 18 are housed to sides 42 of the mold frame 16, a projecting amount L2 of the FPC 15 from the liquid crystal display panel can be deceased.

Figure 5:
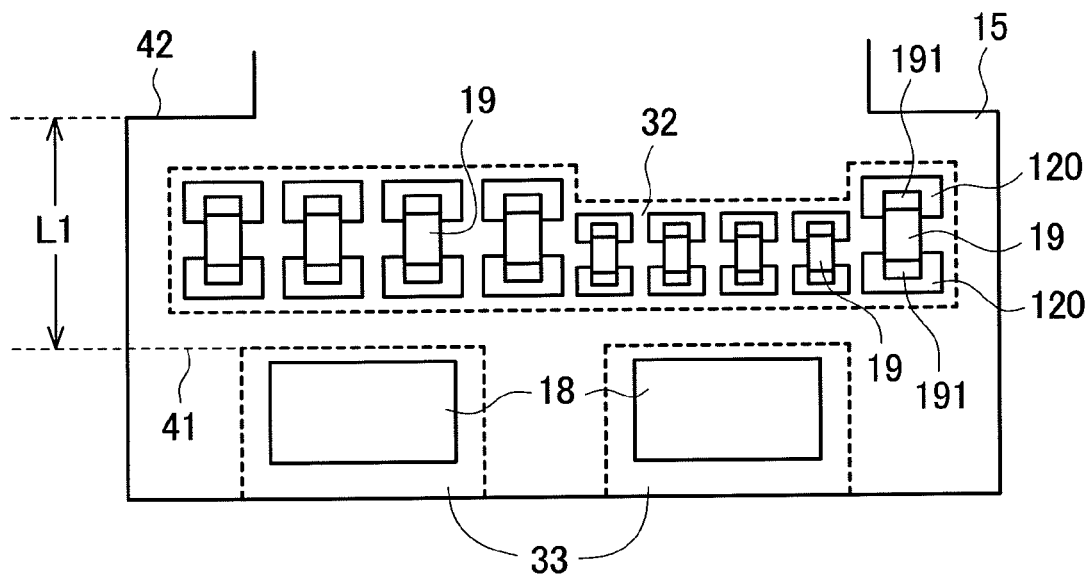
FIG. 5 shows an arrangement state of electronic components mounted on an FPC constituted in accordance with the present invention.

FIG. 5 shows an arrangement state of the electronic components mounted on the FPC 15 having the constitution of the present invention. As shown in FIG. 5, in the present invention, soldering pads 120 are arranged on the FPC 15 in the direction perpendicular to a light incident surface 171 of the light guide plate 17 such that all electronic components 19 which are housed in the housing portion 32 are mounted in the longitudinal direction.

In the present invention, due to such a constitution, the displacement of the electronic components 19 mounted on the FPC 15 is limited only to the lateral direction (the direction parallel to the light incident surface 171 of the light guide plate 17) and hence, it is possible to eliminate the possibility that the electronic components 19 mounted on the FPC 15 is displaced in the longitudinal direction. Accordingly, a length of the housing portion 32 formed in the mold frame 16 can be shortened and hence, the projecting amount L2 of the FPC 15 from the liquid crystal display panel can be decreased whereby a picture frame size can be narrowed.

Embodiment 2

Next, an embodiment 2 of the present invention is explained.

In the embodiment 1, the explanation is made with respect to the example in which the electronic components 19 housed in the housing portion 32 of the mold frame 16 are constituted of the electronic component having two terminals (hereinafter also referred to as two-terminal electronic component).

Figure 6A:
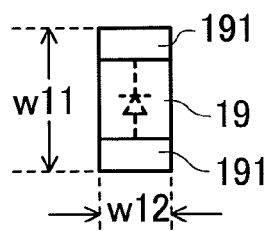
FIG. 6A to FIG. 6E are views showing the electronic components having various configurations.
Figure 6B:
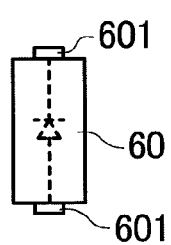

FIG. 6A to FIG. 6B are views showing the electronic components having various configurations.

FIG. 6A shows the two-terminal electronic component explained in conjunction with the embodiment 1. The electronic component is a capacitor, a resistor, a diode or the like, for example. As the two-terminal electronic component 19 explained in the embodiment 1, an electronic component having a longitudinal length w11 of approximately 1.0 mm to 1.6 mm, a lateral length w12 of approximately 0.5 mm to 0.8 mm, and a height of approximately 0.5 mm to 0.9 mm is often used.

FIG. 6B shows a shape of a two-terminal electronic component 60 which differs from the shape of the two-terminal electronic component 19 explained in conjunction with the embodiment 2. The constitution which makes this electronic component 60 different from the two-terminal electronic component 19 of the embodiment 1 lies in that terminals 601 of the electronic component 60 project outwardly.

Figure 6C:
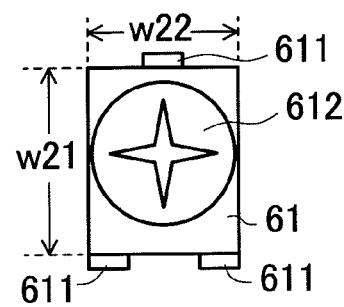

FIG. 6C shows an example of an electronic component 61 having three terminals (also referred to as a three-terminal electronic component). The electronic component 61 is a variable resistor referred to as a chip volume, a resistance value of the electronic component 61 is adjusted by rotating a volume 612. As the three-terminal electronic component 61, an electronic component having a longitudinal length w21 of approximately 2.5 mm to 4.0 mm, a lateral length w22 of approximately 1.4 mm to 3.0 mm, and a height of approximately 0.8 mm to 1.0 mm is often used. Here, the cost of the component is connected to the height of the component. That is, when the cost of the component is high, the component can be made shorter and smaller. On the other hand, when the cost of the component is low, there exists a possibility that the taller and larger component can be mounted.

Figure 6D:
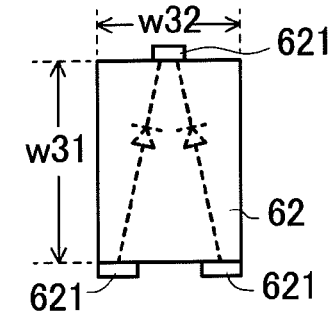

FIG. 6D shows another example of the three-terminal electronic component. The electronic component 62 is a capacitor, a resistor or a diode, for example. As the three-terminal electronic component 62, an electronic component having a longitudinal length w31 of approximately 0.8 mm to 1.6 mm, a lateral length w32 of approximately 0.5 mm to 1.2 mm, and a height of approximately 0.5 mm to 0.9 mm is often used.

Figure 6E:
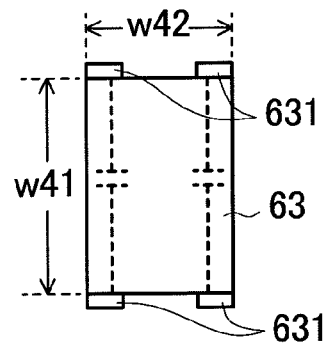

FIG. 6E shows an example of electronic component having four terminals (also referred to as a four-terminal electronic component). The electronic component 63 is a capacitor, a resistor or a diode, for example. As the four-terminal electronic component 63, an electronic component having a longitudinal length w31 of approximately 1.0 mm to 1.6 mm, a lateral length w32 of approximately 1.0 mm to 1.6 mm, and a height of approximately 0.5 mm to 0.9 mm is often used.

As described above, there may be a case that the three-terminal electronic component or the four-terminal electronic component is larger than the two-terminal electronic component in size. Accordingly, some modifications become necessary for mounting the three-terminal electronic component or the four-terminal electronic component on the FPC 15 by making use of the present invention.

Figure 7:
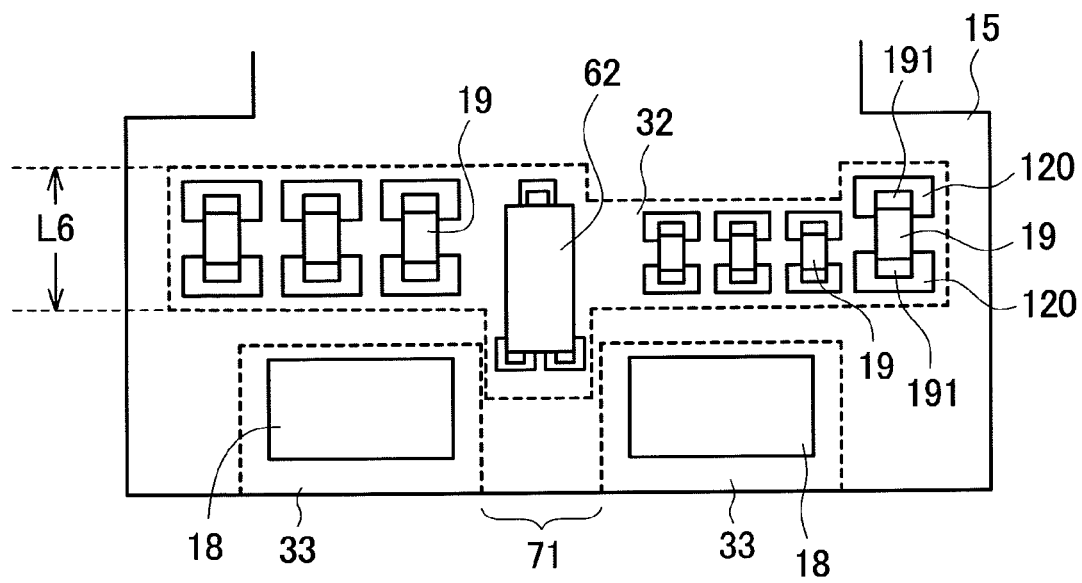
FIG. 7 is a view showing an arrangement of electronic components according to an embodiment 2 of the present invention.

FIG. 7 shows an example in which it is necessary to mount the three-terminal electronic component shown in FIG. 6D on the FPC 15.

As shown in FIG. 7, assume a case in which it is necessary to mount the three-terminal electronic component 62 larger than the two-terminal electronic component 19 in size on the FPC 15, for example. In this case, by mounting the three-terminal electronic component 62 on the FPC 15 in a gap 71 defined between the light sources 18, a projecting amount L2 of the FPC 15 from the liquid crystal display panel can be decreased in the same manner as the embodiment 1 thus narrowing a picture frame size. Here, when such a three-terminal electronic component 62 is arranged, terminals of the electronic component are arranged in the direction perpendicular to the light incident surface of the light guide plate for preventing the electronic component 62 from being displaced in the lateral direction shown in FIG. 7. Alternatively, when it is necessary to mount the three-terminal component and the four-terminal component on the FPC 15 together with the two-terminal components, it is important to arrange the three-terminal component and the four-terminal component such that the three-terminal component and the four-terminal component are housed within a width L6 of the two-terminal components which are arranged parallel to each other in the same direction. Further, even when the three-terminal component or the four-terminal component projects from the width L6, as shown in FIG. 7, the three-terminal component or the four-terminal component is arranged to project in the arrangement direction of the light sources 18.

Embodiment 3

Figure 8:
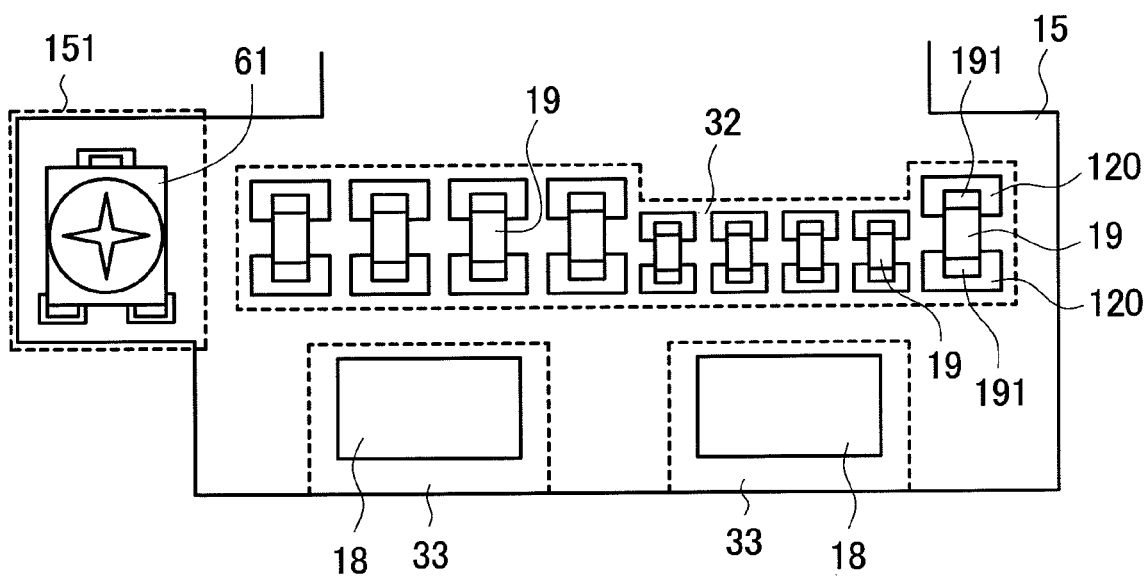
FIG. 8 shows an example according to an embodiment 3 of the present invention, wherein an electronic component having three terminals is arranged on a projecting portion of an FPC.

Another embodiment in which it is necessary to mount the three-terminal electronic component 61 larger than the two-terminal electronic component 19 on the FPC 15 is explained in conjunction with FIG. 8.

For example, in an attempt to arrange the three-terminal electronic component 61 shown in FIG. 6C on the FPC 15, as described above, the height of the three-terminal electronic component 61 ranging from 0.8 mm to 1.0 mm causes a problem.

That is, when the LED is used as the light source 18, the electronic component 61 is higher than the LED. In an attempt to arrange the electronic component 61 at a position explained in conjunction the embodiment 2 in such a state, there exists the possibility that the electronic component 61 comes into contact with the TFT substrate 11. Accordingly, in the constitution of the embodiment 3, such an electronic component 61 is arranged on a projecting portion 151 provided to the FPC 15.

Figure 9:
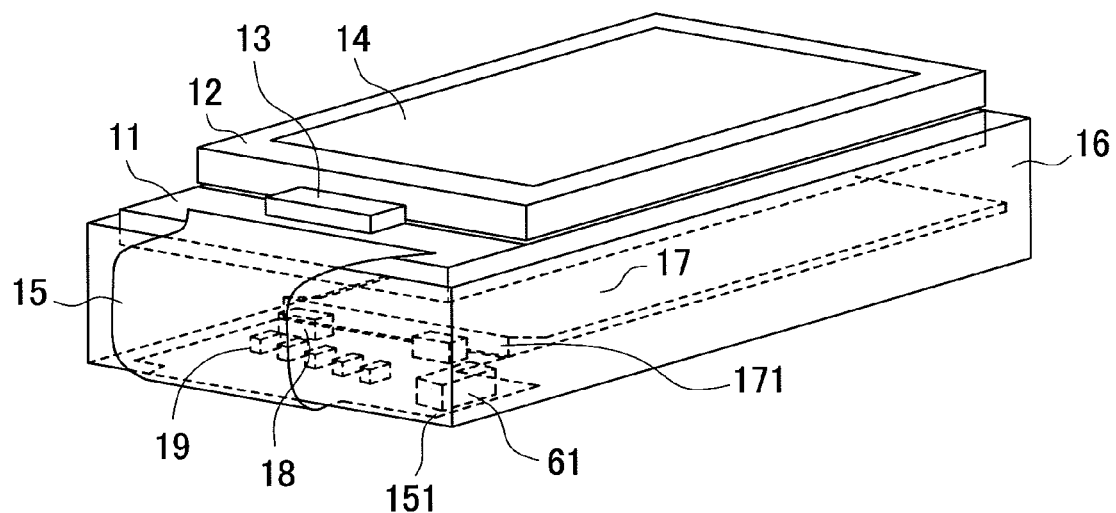
FIG. 9 is a perspective view showing a liquid crystal module according to the embodiment 3 of the present invention.
Figure 10:
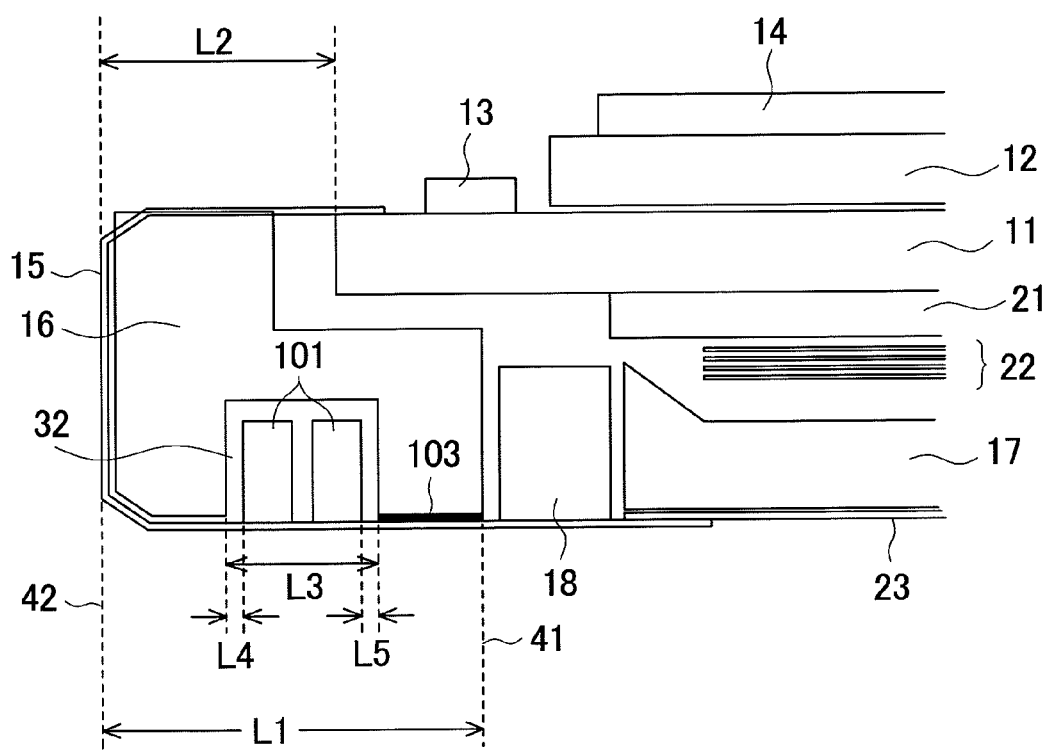
FIG. 10 is a view showing the cross-sectional constitution of an essential part of a conventional liquid crystal display module.
Figure 11:
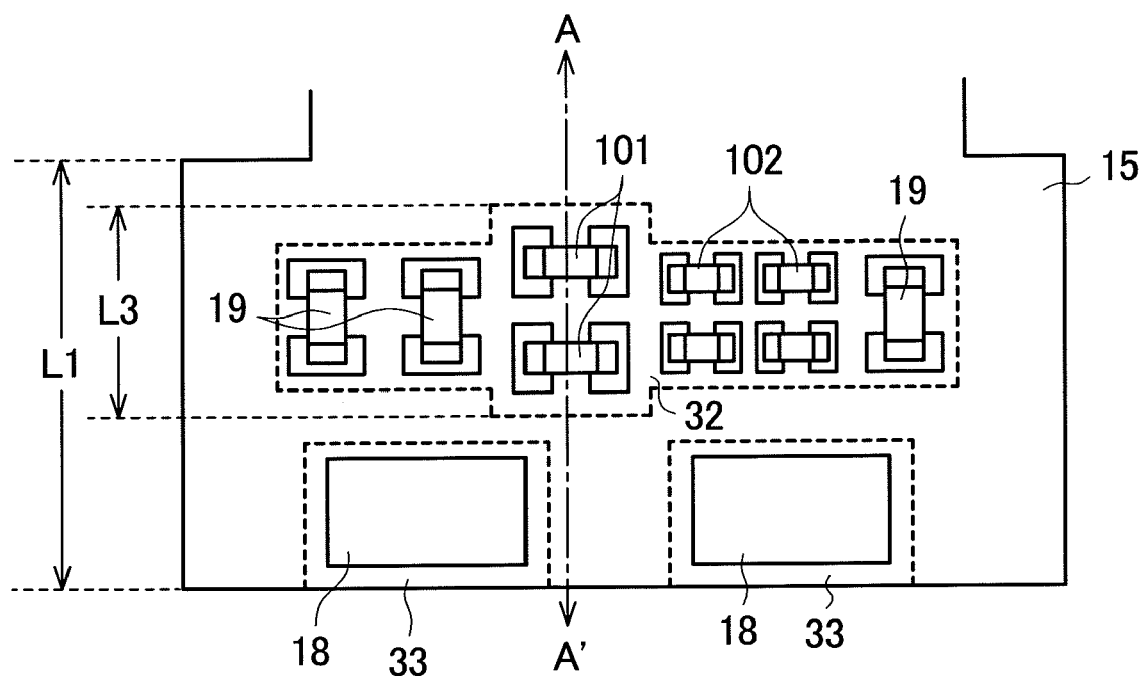
FIG. 11 is a top plan view showing a state that a plurality of electronic components and light sources are mounted on an FPC.
Figure 12A:
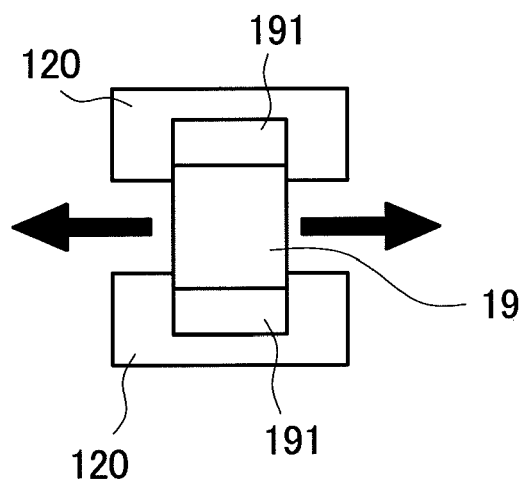
FIG. 12A and FIG. 12B are views showing the relationship among soldering pads, a longitudinally-arranged electronic component, and external terminals of the electronic component which are mounted on the FPC.
Figure 12B:
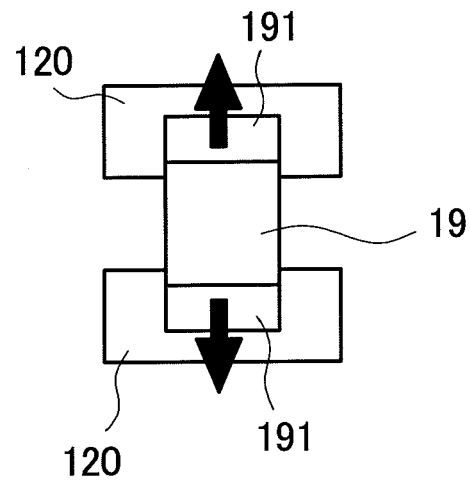

FIG. 9 shows an example in which the three-terminal electronic component 61 is arranged on the projecting portion 151 of the FPC 15. In this example, it is necessary to form a housing portion or a notched portion in the mold frame 15 for preventing the electronic component from being in contact with the mold frame. Here, in the embodiment 3, although the explanation has been made by taking the three-terminal electronic component as an example, the present invention is also applicable to a case that the height of the four-terminal electronic component 63 causes a problem.

What is claimed is:

1. A liquid crystal display module comprising:
a liquid crystal display panel;
a backlight; and
a frame-shaped mold frame capable of mounting the liquid crystal display panel thereon and capable of housing the backlight therein, wherein
the backlight includes a light guide plate arranged to face the liquid crystal display panel in an opposed manner and a light source arranged to face a light incident side surface of the light guide plate in an opposed manner,
the liquid crystal display module includes a flexible printed circuit board which has one end thereof connected to the liquid crystal display panel and another end thereof configured to mount the light source thereon, and is arranged to surround a frame body constituting the mold frame,
a plurality of electronic components is mounted on a side of the flexible printed circuit board on which the light source is mounted, each of the plurality of electronic components having at least two terminals,
a housing portion for housing the plurality of electronic components is formed in a lower side of the mold frame, and
the plurality of electronic components is mounted on the flexible printed circuit board in a state that the at least two terminals of each of the electronic components are arranged parallel to each other in a direction orthogonal to the light incident side surface of the light guide plate;

wherein the housing portion for housing the plurality of electronic components separates the plurality of electronic components housed therein from the light source which is mounted on the same side of the flexible printed circuit board.

2. A liquid crystal display module according to claim 1, wherein each of the plurality of electronic components has only two terminals.

3. A liquid crystal display module according to claim 2, wherein the electronic components are resistors, capacitors or diodes.

4. A liquid crystal display module according to claim 1, wherein each of the plurality of electronic components has two terminals, three terminals, or four terminals, and the number of two-terminal electronic components is set larger than the total number which is an addition of the number of three-terminal electronic components and the number of four-terminal electronic components.

5. A liquid crystal display module according to claim 4, wherein the electronic components are resistors, capacitors or diodes.

6. A liquid crystal display module according to claim 1, wherein the electronic components are resistors, capacitors or diodes.

7. A liquid crystal display module according to claim 1, further comprising:

pads which correspond to respective ones of the plurality of electronic components arranged on the flexible printed circuit board parallel to each other in the direction orthogonal to the light incident side surface of the light guide plate.

* * * * *